(12) United States Patent
Lin et al.

(10) Patent No.: US 8,824,234 B2
(45) Date of Patent: *Sep. 2, 2014

(54) ELECTRICAL FUSE MEMORY

(71) Applicants: Sung-Chieh Lin, Zhubei (TW); David Yen, Chu-Bak (TW); Wei-Li Liao, Taichung (TW); Jiann-Tseng Huang, Hsinchu (TW); Kuoyuan (Peter) Hsu, San Jose, CA (US)

(72) Inventors: Sung-Chieh Lin, Zhubei (TW); David Yen, Chu-Bak (TW); Wei-Li Liao, Taichung (TW); Jiann-Tseng Huang, Hsinchu (TW); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/771,674

(22) Filed: Feb. 20, 2013

(65) Prior Publication Data

US 2013/0155799 A1    Jun. 20, 2013

Related U.S. Application Data

(63) Continuation of application No. 12/839,542, filed on Jul. 20, 2010, now Pat. No. 8,400,860.

(51) Int. Cl.
*G11C 17/16* (2006.01)
(52) U.S. Cl.
USPC .................................................. 365/225.7
(58) Field of Classification Search
None
See application file for complete search history.

(56) References Cited

U.S. PATENT DOCUMENTS

| 5,859,772 | A * | 1/1999 | Hilpert ...................... 363/56.03 |
| 5,936,880 | A | 8/1999 | Payne |
| 6,227,637 | B1 | 5/2001 | Phan |
| 6,324,093 | B1 | 11/2001 | Perner et al. |
| 2005/0104920 | A1 | 5/2005 | Edelen et al. |
| 2009/0201074 | A1 | 8/2009 | Aipperspach et al. |
| 2009/0201713 | A1 | 8/2009 | Shin et al. |

\* cited by examiner

*Primary Examiner* — Hoai V Ho
*Assistant Examiner* — James G Norman
(74) *Attorney, Agent, or Firm* — Lowe Hauptman & Ham, LLP

(57) ABSTRACT

A method of reading an eFuse in a column of eFuse memory cells includes electrically disconnecting a first end of the eFuse from a first electrical path. A second electrical path between a second end of the eFuse and a node is activated to bypass a third electrical path, where the third electrical path includes a diode device between the second end of the eFuse and the node. A footer coupled with the node is turned on.

20 Claims, 4 Drawing Sheets

ELECTRICAL FUSE MEMORY

CROSS-REFERENCE TO RELATED APPLICATION

The present application is a continuation of U.S. application Ser. No. 12/839,542, filed Jul. 20, 2010, which is incorporated by reference herein in its entirety.

TECHNICAL FIELD

The present disclosure is generally related to electrical fuses (eFuses), and particularly, to memories using eFuse bit cells.

BACKGROUND

In the semiconductor manufacturing processes, the process node has transitioned from 90 nanometers (nm) down to 60 nm, to 40 nm, to 28 nm, etc., wherein the size of transistors is reduced for higher capacities. Electrical fuse (eFuse) bit cells used in memories/memory arrays are no exception to the size reduction transition, i.e., their size also continues to decrease.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
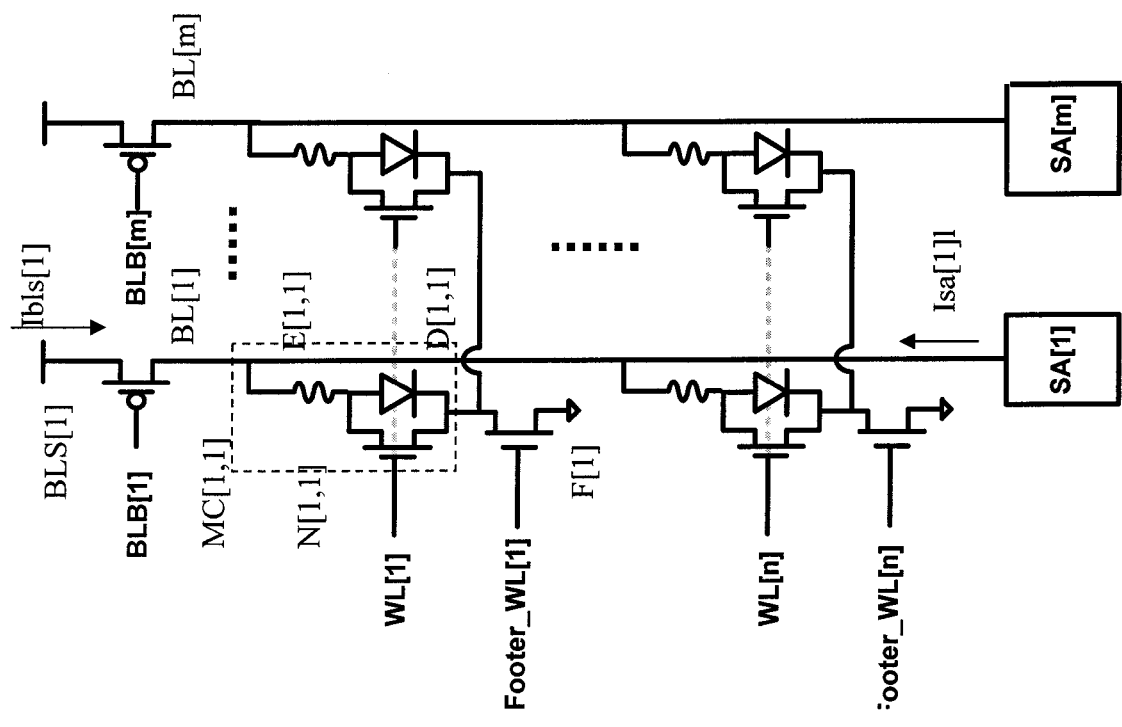
FIG. 1 is a diagram of the memory array of bit cell eFuses, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Exemplary Circuit

FIG. 1 is a diagram of an eFuse memory array 100, in accordance with some embodiments. For illustration, memory array 100 includes m columns and n rows of eFuse memory cells MC (e.g., bit cells MC) associated with m bit lines BL (e.g., bit line BL[1] to bit line BL[m]) and n word lines WL (e.g., word line WL[1] to word line WL[n]). In some embodiments, memory array 100 is a 64×64 cell array (e.g., m=n=64), but the embodiments contemplated by the inventors are not so limited, m and n can be any positive number.

Each bit line BL (e.g., bit line BL[1]) is coupled to the drain of a corresponding transistor BLS (e.g., transistor BLS[1]), and is associated with n memory cells (e.g., memory cells MC[1,1] to MC[n,1]) and a sense amplifier SA (e.g., sense amplifier SA[1]).

A transistor BLS is commonly called a bit line select transistor, a program control device, a control device, etc. A signal BLB controls a corresponding transistor BLS. For example, when a signal BLB (e.g., signal BLB[1]) is activated (e.g., driven with a high logic (a High)), it turns on the corresponding transistor BLS (e.g., transistor BLS[1]), and when it is de-activated (e.g., driven with a low logic (a Low)), it turns off the corresponding transistor BLS. In some embodiments, a transistor BLS (e.g., transistor BLS[1]) is turned on to generate a current (e.g., current Ibsl[1]) to program a memory cell MC on the corresponding bit line (e.g., bit line BL[1]) and is turned off when a memory cell MC on the bit line is read.

In some embodiments, a memory cell MC includes an eFuse E, a diode D, and an NMOS transistor N. For illustration, only details of memory cell MC[1,1] are shown that includes an eFuse E[1,1], a diode D[1,1], and an NMOS transistor N[1,1], and the below illustrative description is based on memory cell MC[1,1]. The operation of other memory cells MC is similar to that of memory cell MC[1,1]. eFuse E[1,1] is coupled in series with transistor N[1,1] that is coupled in parallel with diode D[1,1]. An eFuse E generally includes two logic states, e.g., a Low and a High. In some embodiments, an eFuse E is Low when its resistance is Low and is High when its resistance is High. Further, if R represents the resistance of an eFuse E, the eFuse E is Low if R is less than about 100 Ohm, and is High if R is higher than about 10K Ohm (e.g., the eFuse E is an open circuit). In some embodiments, the eFuses E in memory array 100 are Low after memory array 100 is manufactured and an eFuse E is High after it is programmed. Further, the logic level of an eFuse E represents the data logic of the corresponding memory cell MC. For example, if an eFuse (e.g., eFuse E[1,1]) is Low then memory cell MC[1,1] is considered as storing a Low, but if eFuse E[1,1] is High, then memory cell MC[1,1] is considered as storing a High. To determine the logic state or the data of a memory cell MC, the data is detected at the corresponding bit line. For example, to read the data from memory cell M[1,1], if bit line BL[1], at the time of reading, is detected High then the data of memory cell M[1,1] is High, but if bit line BL[1], at the time of reading, is detected Low, then the data of memory cell M[1,1] is Low. In some embodiments, an eFuse E is closed when its resistance R is Low and is open when its resistance is High. The current used to burn (e.g., open/break) an eFuse E varies depending on the technologies. For example, in some embodiments related to 0.25 μm process technology node, current Ibls is in the range of 40 mA, while in the 0.4 μm node, current Ibls is in the range of 9-10 mA.

When a memory cell MC (e.g., memory cell MC[1,1]) is read, a transistor N (e.g., transistor N[1,1]) provides a current path for a current Isa (e.g., current Isa[1]) to flow through transistor N[1,1] (and footer F[1] to ground). When memory cell MC[1,1] is programmed, transistor N[1,1] is turned off so that current Isa[1] flows through the corresponding diode D[1,1]. In some embodiments, because in a reading mode, memory array 100 uses a low VDD voltage (e.g., VDD is about 1.8 V) and thus a low current Isa. The corresponding transistor N is therefore sized sufficient to handle current Isa, which is advantageous over other approaches wherein transistor N is used for both programming and reading.

When a memory cell MC is programmed, the corresponding diode D is used as a current path for the memory cell MC. For example, when memory cell MC[1,1] is programmed, transistor N[1,1] is turned off so that the programming current Ibsl[1] flows through diode D[1,1] (and footer F[1] to ground). In some embodiments, because the programming current Ibsl[1] is larger than the reading current Isa[1], diode D[1,1] is designed large enough to handle current Ibls[1]. In some embodiments, a transistor N is sized appropriate for reading while a diode D is sized appropriate for programming. As a result, the die size for a memory MC that includes a transistor N and a diode D is optimum. For example, a transistor (e.g., transistor N') that can handle the currents for both programming (e.g., current Ibsl) and reading (e.g., current Isa) could be much larger than the size of the combination of a transistor N and a diode D.

A word line WL controls (e.g., turns on or off) the corresponding plurality of transistors N in a row. For example, if a word line, e.g., word line WL[1] for row 1, is activated (e.g., applied with a High), word line WL[1] turns on all transistors N[1,1] to N[1,m] in row 1. But if word line WL[1] is deactivated, it turns off all transistors N[1,1] to N[1,m] in row 1.

A footer F serves as a current path for the plurality of memory cells MC in a row for both programming and reading the corresponding memory cell. For example, footer F[1] in row 1 serves as a current path for memory cells MC[1,1] to MC[1,m] in row 1, footer F[2] serves as a current path for memory cells MC[2,1] to MC[2,m] in row 2, and footer F[3] serves as a current path for memory cells MC[3,1] to MC[3,m] in row 3, etc. In some embodiments, a footer F (e.g., footer F[1]) is designed large enough to handle the larger of current Ibls (e.g., current Ibsl[1]) used in programming and current Isa (e.g., current Isa[1]) used in reading.

A sense amplifier SA is used to read/sense the data in memory cells MC in a column. Further, in some embodiments, a sense amplifier SA, when appropriate, provides a High to a corresponding bit line BL that represents the High data to be read from a memory cell MC. A current Isa (e.g., current Isa[1]) generated by a corresponding sense amplifier SA (e.g., sense amplifier SA[1]) is used in reading data from a memory cell MC associated with the corresponding bit line BL (e.g., bit line BL[1]).

Figure 2:
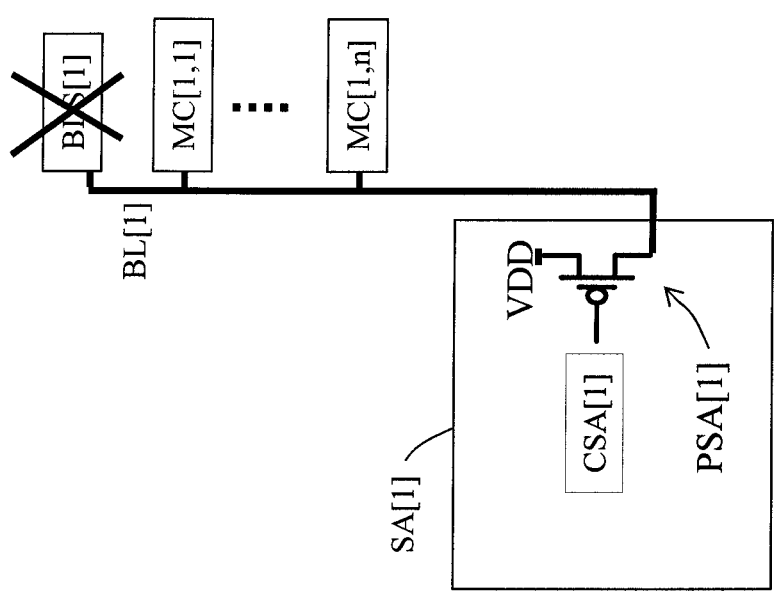
FIG. 2 is a diagram of a circuit illustrating how a sense amplifier provides a high logic level to a bit line in the memory array of FIG. 1, in accordance with some embodiments.

FIG. 2 is a diagram of a circuit 200 illustrating how sense amplifier SA[1] provides a High to the corresponding bit line BL[1], in accordance with some embodiments. As illustratively shown, bit line BL[1] couples transistor BLS[1], memory cells MC[1,1] to MC[1,n], and sense amplifier SA[1]. PMOS transistor PSA[1] is part of sense amplifier SA[1]. For simplicity, other circuitry of sense amplifier SA[1] is not shown. In some embodiments, at the time sense amplifier SA[1] provides the High to bit line BL[1], bit line BL[1] is floating, i.e., electrically disconnected from transistor BLS [1], which is illustratively shown as crossed out. Transistor PSA[1], when turned on, transfers the voltage level of voltage VDD from its source to its drain coupled to bit line BL[1] and thus pulls up bit line BL[1] to a High (e.g., voltage VDD). Signal CSA[1] applied at the gate of transistor PSA[1] controls transistor PSA[1]. For example, when signal CSA[1] is activated (e.g., driven with a Low), transistor PSA[1] turns on, but when signal CSA[1] is deactivated (e., driven with a High), transistor PSA[1] turns off. In some embodiments, the resistance of an eFuse (e.g., eFuse E[1,1]) is much lower than that off the resistance of PMOS transistor PSA[1].

Exemplary Operation

In some embodiments, after memory array 100 is manufactured, all eFuses E in memory array 100 are closed, i.e., all eFuse resistances are Low. When appropriate, an eFuse is programmed to be High by having a current flow through the eFuse to break the eFuse, i.e., to cause an open circuit or a High resistance value. To program an eFuse, the corresponding transistor BLS and Footer F are on, and the corresponding transistor N is off. For example, to program eFuse E[1,1], signal BLB[1] is activated to turn on transistor BLS[1], and signal Footer_WL[1] is activated to turn on footer F[1]. At the same time, signals Footer_WL[2] to Footer_WL[n] are off, which prevent current Ibls[1] from flowing through footers F[2] to F[n]. As a result, current Ibls[1], flows from the source of transistor BLS[1] through diode D[1,1], and transistor F[1,1] to ground. In some embodiments, transistors BLS are designed to provide the large current Ibls to break eFuses E. Similarly, diodes D are designed large enough to handle the current Ibls sufficient to break eFuses. In some embodiments, a current Ibls (e.g., current Ibls [1]), is in the range of 25 mA to 45 mA, diode D[1,1] has an area ranging from 4 to 8 $\mu m^2$.

In some embodiments, to read data from an eFuse E, the data is detected at the corresponding bit line BL. In that situation, the corresponding transistor BLS is turned off, and the corresponding sense amplifier SA, transistor N, and footer F are turned on. Depending on whether the eFuse is closed or open, the respective logic Low or High appears at the corresponding bit line BL, and is read therefrom. For example, to read data from memory cell MC[1,1], the data is read from bit line BL[1]; transistor BLS[1] is turned off; sense amplifier SA[1,1], transistor N[1,1], and footer F[1] are turned on. If eFuse[1,1] is open (e.g., High), sense amplifier SA[1] through transistor PSA[1] provides a High to bit line BL[1]. The read data is therefore High. If, however, eFuse[1,1] is closed (e.g., Low), current Isa[1] from sense amplifier SA[1] flows through eFuse E[1,1], transistor N[1,1] and footer F[1] to ground. Because NMOS transistor N[1,1] and footer F[1], also an NMOS transistor, are on, they pull the voltage level at bit line BL[1,1] to the level at the source of transistor F[1], which is ground or Low. In some embodiments, bit line BL[1] is raised by a voltage drop across eFuse[1,1], but this voltage is insignificant because the resistance value of eFuse[1,1] is small (e.g., about 100 Ohm) and current Isa[1] is also small (e.g., in the range of 500 $\mu$A to 1.5 mA). In some embodiments, transistor PSA[1] is designed such that current Isa[1] is small and insignificant to break eFuse[1,1].

Illustrative Methods

Figure 3:
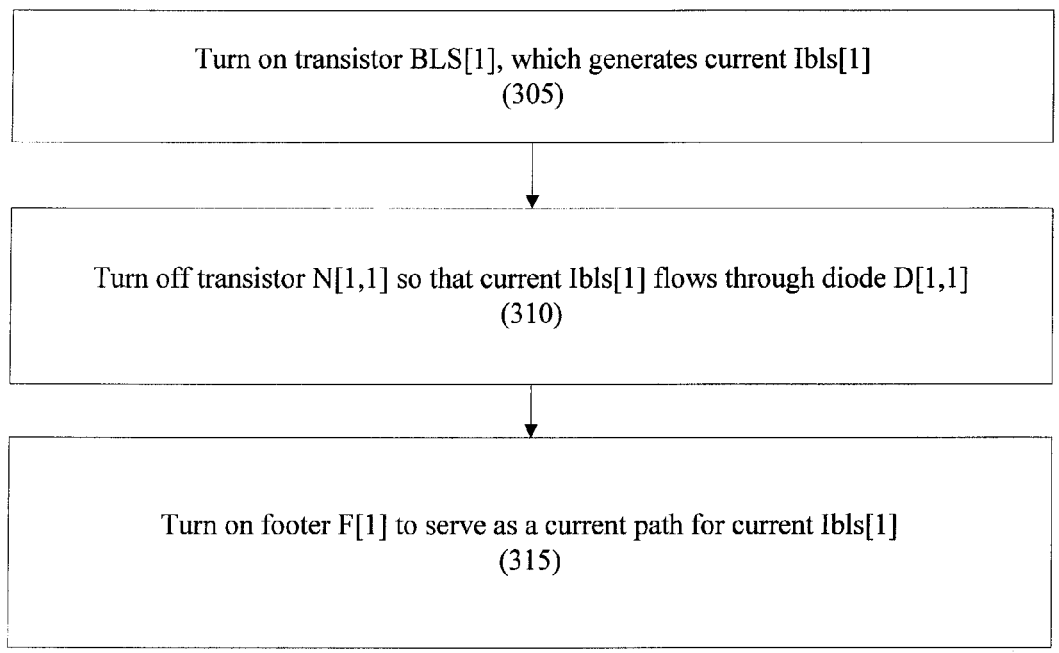
FIG. 3 is a flowchart illustrating a method of programming a memory cell of the memory array in FIG. 1, in accordance with some embodiments.

FIG. 3 is a flowchart 300 illustrating a method of programming a memory cell MC[1,1] in accordance with some embodiments. In effect, the method is to burn (e.g., break) eFuse E[1,1].

In step 305, transistor BLS[1] is turned on, which generates current Ibsl[1]. Transistors BLS[2] to BLS[m] are turned off.

In step 310, transistor N[1,1] is turned off so that the current Ibsl[1] that flows through eFuse E[1,1] flows through diode D[1,1].

In step 315, footer F[1] is turned on to serve as a current path for current Ibls[1] to break eFuse E[1,1]. Footers F[2] to F[n] are turned off to electrically disconnect memory cells MC[2,1] to MC[n,1] from bit line BL[1].

In the above steps, because current Ibsl[1] flows through eFuse E[1,1] (diode D[1,1], and footer F[1]) current Ibsl[1] breaks eFuse E[1,1]. As a result, eFuse E[1,1] changes the resistance or logic state from a Low to a High. In effect, memory cell MC[1,1] is programmed from a Low to a High.

Figure 4:
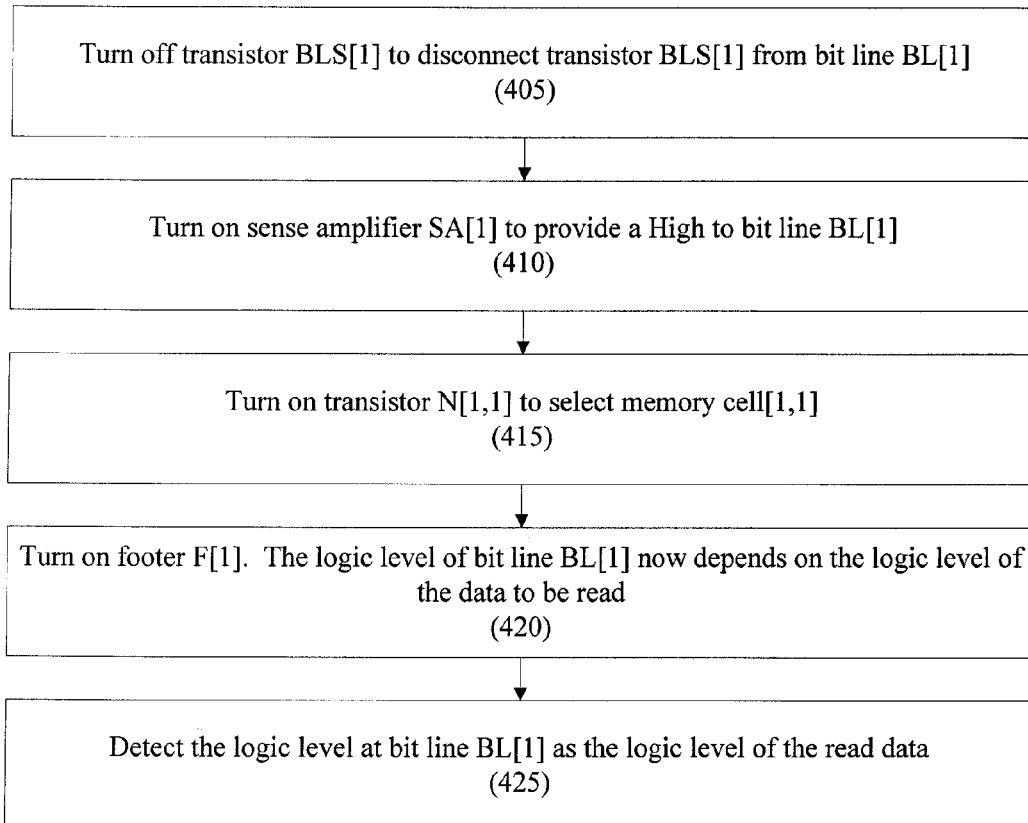
FIG. 4 is a flowchart illustrating a method of reading data from a memory cell of the memory array in FIG. 1, in accordance with some embodiments.

FIG. 4 is a flowchart 400 illustrating a method for reading data from memory cell M[1,1], in accordance with some embodiments.

In step 405, transistor BLS[1] is turned off and therefore electrically disconnected from bit line BL[1].

In step 410, sense amplifier SA[1] is turned on to provide a High to bit line BL[1].

In step 415, transistor N[1,1] is turned on to select memory cell MC[1,1].

In step 420, footer F[1] is turned on to provide a current path for current Isa[1] if eFuse E[1,1] is closed.

In the above steps, if eFuse[1,1] is open, bit line BL[1] remains at the High logic level provided by sense amplifier SA[1]. But if eFuse[1,1] is closed, current Isa[1] flows through eFuse E[1,1], transistor N[1,1] and footer[1]. As a result, the voltage level of bit line BL[1] is pulled to the voltage level at the source of footer/transistor F[1], which is ground or Low.

In step 425, the logic state of bit line BL[1] is detected (e.g., read), which represents the logic state of eFuse E[1,1] or the logic state or data of memory cell MC[1,1].

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of embodiments. The logic level (e.g., Low or High) of the various signals used in the above description is also for illustration purposes, the disclosed embodiments are not limited to a particular level when a signal is activated and/or deactivated, but, rather, selecting such a level is a matter of design choice.

For another example, in some embodiments, a method of reading an eFuse in a column of eFuse memory cells includes electrically disconnecting a first end of the eFuse from a first electrical path. A second electrical path between a second end of the eFuse and a node is activated to bypass a third electrical path, where the third electrical path includes a diode device between the second end of the eFuse and the node. A footer coupled with the node is turned on.

For another example, in some embodiments, a method of programming an eFuse in a column of eFuse memory cells includes electrically coupling a first end of the eFuse with a first electrical path. A second electrical path between a second end of the eFuse and a node is deactivated. A footer coupled with the node is turned on. The eFuse is changed from a low-resistance state to a high-resistance state by a current flow through the first electrical path, the eFuse memory cell, a third electrical path, and the footer, where the third electrical path includes a diode device between the second end of the eFuse and the node.

For another example, in some embodiments, a memory array includes a plurality of eFuse memory cells arranged in columns and rows, a plurality of footers, a first set of word lines, and a second set of word lines. Each of the plurality of eFuse memory cells includes an eFuse, a diode, and a transistor. The eFuse has a first end coupled to a bit line of a corresponding one of the columns and a second end. The diode is coupled between the second end of the eFuse and a node of the corresponding eFuse memory cell. The transistor is coupled between the second end of the eFuse and the node. Each of the plurality of footers is coupled to the nodes of the eFuse memory cells of a corresponding one of the rows. Each of the first set of word lines is coupled to gate terminals of the transistors of the eFuse memory cells of a corresponding one of the rows. Each of the second set of word lines is coupled to a corresponding one of the footers.

The above methods show exemplary steps, but they are not necessarily performed in the order shown. Steps may be added, replaced, changed order, and/or eliminated as appropriate, in accordance with the spirit and scope of the disclosed embodiments.

What is claimed is:

1. A method of reading an eFuse in a column of eFuse memory cells, the method comprising:
   electrically disconnecting a first end of the eFuse from a first electrical path;
   activating a second electrical path between a second end of the eFuse and a node to bypass a third electrical path, the third electrical path comprising a diode device between the second end of the eFuse and the node; and
   turning on a footer coupled with the node.

2. The method of claim 1, wherein the activating the second electrical path comprises turning on a transistor coupled between the second end of the eFuse and the node.

3. The method of claim 2, wherein the transistor is an N-type transistor, and the turning on the transistor comprises setting a voltage level at a gate terminal of the N-type transistor at a logic high level.

4. The method of claim 1, wherein the electrically disconnecting the first end of the eFuse from the first electrical path comprises turning off a transistor coupled between the first end of the eFuse and the first electrical path.

5. The method of claim 4, wherein the transistor is a P-type transistor, and the turning off the transistor comprises setting a voltage level at a gate terminal of the P-type transistor at a logic high level.

6. The method of claim 1, wherein the footer is an N-type transistor, and the turning on the footer comprises setting a voltage level at a gate terminal of the N-type transistor at a logic high level.

7. The method of claim 1, further comprising:
   turning on a sense amplifier to sense a voltage level at the first end of the eFuse after the footer is turned on.

8. A method of programming an eFuse in a column of eFuse memory cells, the method comprising:
   electrically coupling a first end of the eFuse with a first electrical path;
   deactivating a second electrical path between a second end of the eFuse and a node;
   turning on a footer coupled with the node; and
   changing the eFuse from a low-resistance state to a high-resistance state by a current flow through the first electrical path, the eFuse memory cell, a third electrical path, and the footer, the third electrical path comprising a diode device between the second end of the eFuse and the node.

9. The method of claim 8, wherein the deactivating the second electrical path comprises turning off a transistor coupled between the second end of the eFuse and the node.

10. The method of claim 9, wherein the transistor is an N-type transistor, and the turning off the transistor comprises setting a voltage level at a gate terminal of the N-type transistor at a logic low level.

11. The method of claim 8, wherein the electrically coupling the first end of the eFuse with the first electrical path comprises turning on a transistor coupled between the first end of the eFuse and the first electrical path.

12. The method of claim 11, wherein the transistor is a P-type transistor, and the turning on the transistor comprises setting a voltage level at a gate terminal of the P-type transistor at a logic low level.

13. The method of claim 8, wherein the footer is an N-type transistor, and the turning on the footer comprises setting a voltage level at a gate terminal of the N-type transistor at a logic high level.

14. A memory array, comprising:
a plurality of eFuse memory cells arranged in columns and rows, each of the plurality of eFuse memory cells comprising:
an eFuse having a first end coupled to a bit line of a corresponding one of the columns and a second end;
a diode coupled between the second end of the eFuse and a node of the corresponding eFuse memory cell; and
a transistor coupled between the second end of the eFuse and the node;
a plurality of footers, each of the plurality of footers coupled to the nodes of the eFuse memory cells of a corresponding one of the rows;
a first set of word lines, each of the first set of word lines coupled to gate terminals of the transistors of the eFuse memory cells of a corresponding one of the rows; and
a second set of word lines, each of the second set of word lines coupled to a corresponding one of the footers.

15. The memory array of claim 14, further comprising:
a plurality of sense amplifiers, each of the plurality of sense amplifiers coupled to a corresponding one of the bit lines.

16. The memory array of claim 14, wherein the transistors of the plurality of eFuse memory cells are N-type transistors.

17. The memory array of claim 14, wherein the plurality of footers are N-type transistors.

18. The memory array of claim 14, further comprising:
a plurality of bit line select transistors, each of the plurality of bit line select transistors coupled to a corresponding one of the bit lines.

19. The memory array of claim 18, wherein the bit line select transistors are P-type transistors.

20. The memory array of claim 18, further comprising:
a sense amplifier configured to be coupled to one of the plurality of bit lines,
wherein one of the bit line select transistors corresponding to the one of the plurality of bit line is configured to be turned off when the sense amplifier is turned on.

* * * * *